United States Patent [19]

Robb et al.

[11] Patent Number: 4,847,214

[45] Date of Patent: Jul. 11, 1989

[54] METHOD FOR FILLING TRENCHES FROM A SEED LAYER

[75] Inventors: Francine Y. Robb, Tempe; F. J. Robinson, Scottsdale; Bridget Svechovsky, Phoenix; Thomas E. Wood, Chandler, all of Ariz.

[73] Assignee: Motorola Inc., Schaumburg, Ill.

[21] Appl. No.: 182,816

[22] Filed: Apr. 18, 1988

[51] Int. Cl.[4] .................... H01L 21/205; H01L 21/76
[52] U.S. Cl. ........................................ 437/67; 437/78;
      437/90
[58] Field of Search ................ 437/67, 78, 79, 90;
      357/49, 50

[56] References Cited

U.S. PATENT DOCUMENTS

| Re. 32,090 | 3/1986 | Jaccodine et al. | 357/51 |
|---|---|---|---|
| 4,473,598 | 9/1984 | Ephrath et al. | 156/643 |
| 4,476,623 | 10/1984 | El-Kareh | 156/643 |
| 4,528,047 | 7/1985 | Beyer et al. | 437/67 |
| 4,688,063 | 8/1987 | Lu et al. | 357/23.6 |
| 4,689,656 | 10/1987 | Silvestri et al. | 357/49 |
| 4,702,795 | 10/1987 | Douglas | 156/643 |

FOREIGN PATENT DOCUMENTS 60-124839  7/1985  Japan ..................................... 437/78

OTHER PUBLICATIONS

H. S. Bhatia et al., "Poly Filled Trench Isolation", IBM Technical Disclosure Bulletin, vol. 25, No. 3B, Aug. 1982, pp. 1482–1484.

*Primary Examiner*—Olik Chaudhuri
*Attorney, Agent, or Firm*—Robert M. Handy; Joe E. Barbee

[57] ABSTRACT

Filled trenches useful in semiconductor devices for isolation or other purposes are provided by etching a trench in the semiconductor substrate, lining the trench with a first material (e.g., silicon dioxide), covering the first material with a seed layer (e.g., polysilicon) for nucleating a further material, removing a part of the seed layer on the first material in an upper part of the trench, and then filling the trench by selectively depositing the further material (e.g., polysilicon) on the remaining seed layer.

Thermally grown silicon dioxide is convenient for the first material. The first material and seed layer may extend over the substrate surface. The upper portion of the seed layer is conveniently removed by first covering the seed layer with a mask (e.g., photoresist) and then etching back the mask to expose the seed layer above the substrate surface and in the upper portion of the trench, leaving part of the mask in the lower portion of the trench. The exposed portion of the seed layer is then etched away. The remaining portion of the mask is removed before growing the trench filling material on the remaining part of the seed layer in the trench.

20 Claims, 3 Drawing Sheets

4,847,214

METHOD FOR FILLING TRENCHES FROM A SEED LAYER

TECHNICAL FIELD

The present invention concerns a method for forming filled trenches in electrical devices and, more particularly, an improved method for filling trenches in semiconductor or other substrates using a nucleating seed layer. The filled trenches may be used for isolation purposes or as capacitors or for other functions.

BACKGROUND ART

It is known to form trenches in semiconductor substrates and then refill the trenches with a variety of materials in order to provide isolation walls between devices in integrated circuits (IC's), or to provide buried capacitors for memory devices or other electrical functions, or for other purposes. Silicon is the most commonly used semiconductor substrate, but other semiconductor materials may also have trenches formed therein. The trenches may be filled with insulators such as silicon oxide or nitride or glasses or polymers or combinations thereof, or may be wholly or partially filled with conductors such as polycrystalline semiconductors (e.g., polysilicon or poly-germanium or mixtures thereof), or may be filled with a combination of dielectrics and conductors, as for example, with a dielectric liner and a polycrystalline semiconductor core. Typical prior art methods for forming and filling trenches are described in U.S. Pat. Nos. 4,473,598, RE 32,090, 4,688,063, 4,702,795, 4,476,623 and 4,689,656 which are incorporated herein by reference.

For example, in U.S. Pat. No. 4,473,598, filled trenches are formed by etching a trench in a semiconductor substrate, providing a dielectric liner in the trench, applying a nucleating seed layer to the bottom of the trench or to the bottom and sides of the trench and the dielectric surface outside the trench, selectively growing a silicon layer on the seed layer to over-fill the trench, applying a planarizing layer and then etching back the planarizing layer and excess silicon to approximately the level of the substrate surface. While this process gives filled trenches, it has a number of drawbacks, among which are the excess silicon which must be deposited to overfill the trench for planarization, the difficulty in adequately controlling the selective silicon growth process in the trench and the difficulty in obtaining a substantially smooth upper surface on the filled trench free from mounds, grooves and defects.

Accordingly, it is an object of the present invention to provide an improved process for forming filled trenches in substrates, particularly semiconductor substrates.

It is a further object of the present invention to provide an improved process for forming trenches filled with polycrystalline semiconductor.

It is an additional object of the present invention to provide such filled trenches with a dielectric liner.

It is a further object of the present invention to provide an improved process for forming filled trenches wherein a post-filling planarizing step is not necessary.

As used herein the word or prefix "poly" or the words "polylayer" and "poly layer" are intended to refer generally to polycrystalline or amorphous materials, including but not limited to semiconductor materials.

SUMMARY OF THE INVENTION

These and other objects and advantages are achieved by a process comprising, providing a substrate (e.g., silicon), etching a trench therein, lining the trench with a first non-nucleating material (e.g., silicon oxide); covering the first material with a nucleating seed layer (e.g., polysilicon), removing the seed layer from the first material on the sidewalls in an upper part of the trench leaving a second part of the seed layer on at least the bottom and optionally the sidewalls in a lower part of the trench, and filling the trench to the desired level by selectively growing additional material (e.g., polysilicon) on the seed layer. By terminating selective growth when the additional material reaches the top of the trench, an etch-back or lap-back of the trench fill material is avoided. It is desirable that the balance of the substrate surface (not in the trench) be covered with the non-nuclearing layer and be free of the nucleating seed layer.

The location of the seed layer in the trench is conveniently determined by first covering the seed layer with a mask, preferably of a planarizing type material such as a resist or the like which fills the trench and extends above the substrate surface, then etching or dissolving away the portion of the mask that extends above the substrate above the seed layer in an upper part of the trench. This leaves a remaining portion of the mask in a lower part of the trench covering a lower part of the seed layer. The portion of the seed layer exposed where the mask has been removed is then etched away leaving behind the seed layer in the lower portion of the trench. The height of the seed layer on the sidewalls of the trench is easily adjusted according to how much of the mask in the trench is removed.

Among other things, the invented process has the advantage compared to the prior art that control of the fill process is simplified by providing through the etch-back of the seed layer mask, a continuously adjustable seed layer which permits improved refill without need for overfilling and etching back the refill material itself, although that is not precluded.

DETAILED DESCRIPTIONS OF THE FIGURES

In the discussion that follows, the process is described for the case of a silicon semiconductor substrate using silicon oxide and/or silicon nitride as dielectric materials, and using polysilicon as a nucleating and trench fill material. However, those of skill in the art will appreciate that this is merely for purposes of explanation and not intended to be limiting, and will further understand that other substrates and other conductors, including other semiconductors, and other dielectrics may also be used.

Figure 1:
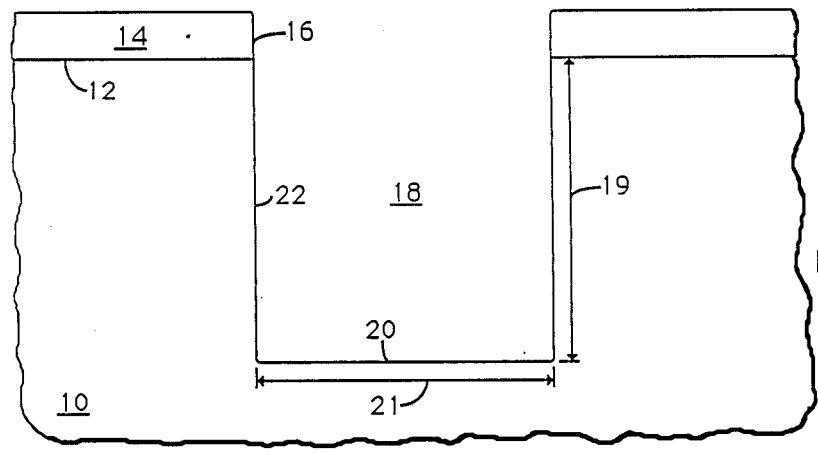
FIGS. 1-7 show simplified schematic cross-sections through a semiconductor substrate in which a trench is formed and filled according to the present invention and at different stages in the process.

FIG. 1 shows a portion of semiconductor substrate 10 (e.g., silicon) having surface 12 which has been covered by mask 14 having opening 16. Mask 14 is of any convenient material (e.g., resist or oxide or nitride or combinations therefor) for protecting surface 12 of substrate 10 from etching except in opening 16. Positive resist is convenient. Trench 18 having bottom 20 and sidewall 22 is etched in substrate 10 from surface 12. Trench 18 has depth 19 and width 21. While trench 18 is shown as having substantially vertical sidewalls, this is merely for simplicity of explanation, and not essential. practice, it is generally desired to etch trench 18 anisotropically so that width 21 is the same or narrower than opening 16 so as to maintain good dimensional control. In general, it is desirable that trench 18 be wider at the top at surface 12 than at bottom 20. Accordingly, in most cases trench 18 will taper inwardly by a few degrees from surface 12 toward bottom 20, but this is not essential.

Trench 18 usefully has depth 19 in the range of about 15 to 25 micrometers with about 20 micrometers being typical, and width 21 in the range of about 3 to 6 micrometers with about 4 micrometers being typical. However, larger or smaller values may also be used. Mask 14 may be removed or may be left in place. In order to leave mask 14 in place, it should be fabricated from a refractory material, such as for example, an oxide, nitride, glass or combination thereof.

Figure 2:
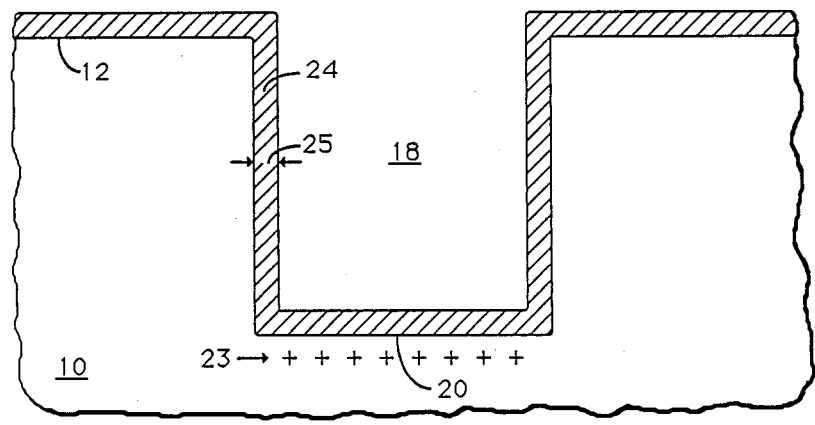

Trench 18 is covered by liner 24 (see FIG. 2). It is essential that liner 24 be substantially non-nucleating so far as the trench filling material to be applied later is concerned. Silicon oxide and nitride are examples of materials which may be nucleating or non-nucleating to polysilicon and other materials suitable for filling trench 18, according to the deposition conditions used with the filling materials. Deposition conditions for achieving non-nucleating behavior are well known in the art. For example, U.S. Pat. No. 4,473,598 to Ephrath, which disclosure is incorporated herein by reference, describes procedures for depositing silicon selectively on a silicon or polysilicon nucleating surface without substantial nucleation on an adjacent silicon oxide surface. For simplicity, layer 14 has been omitted from the description that follows and FIGS. 2-7, but those of skill in the art will understand that layer 14 may be left in place on surface 12, in which case it would serve as the part of dielectric layer 24 on surface 12 (see FIG. 2).

Layer 24 has thickness 25 and is conveniently formed by thermal oxidation of substrate 10. It is desirable that layer 24 extend over surface 12 as well as covering surfaces 20, 22 of trench 18. Thickness 25 is usefully about 0.1 to 1.0 micrometers with about 0.4 to 1.0 micrometers being typical and about 0.5 micrometers being convenient.

Figure 3:
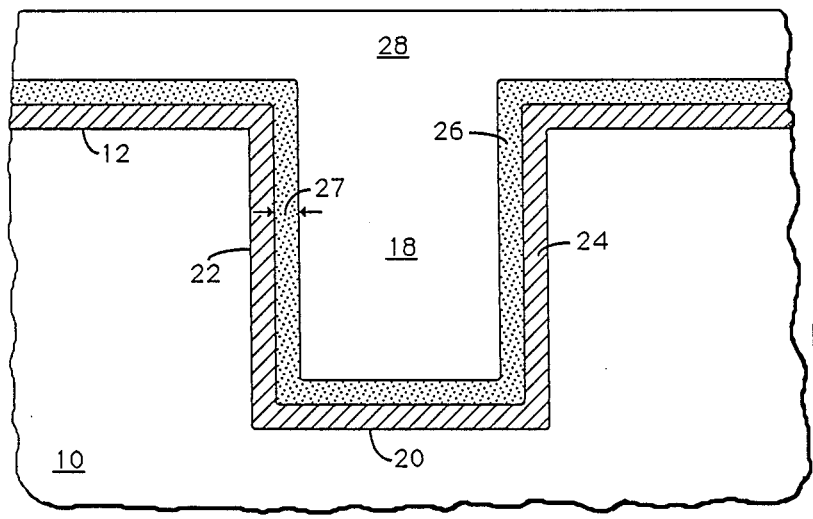
Figure 4:
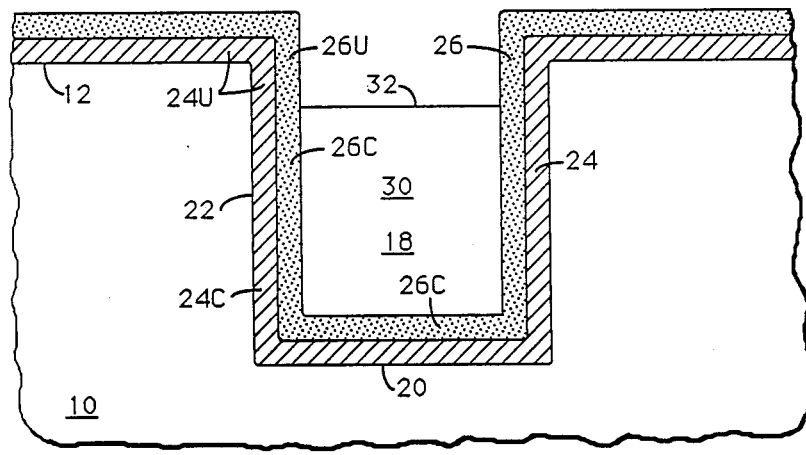

Layer 24 in trench 18 is then covered with nucleating seed layer 26 of thickness 27 (see FIG. 3). Polysilicon or other polycrystalline semiconductor is suitable, but other materials can also be used. For example, chromium and other refractory metals or intermetallics are known to act as nucleating agents for many materials. Silicon has an advantage as a nucleating or seed material in that it is readily avilable in most semiconductor process lines and may be prepared with carefully controlled properties. It also adheres well to silicon nitride, silicon oxide, mixtures thereof, glasses and other materials. In general, layer 26 is polycrystalline or amorphous. Thickness 27 in the range of about 0.05 to 0.15 micrometers is suitable with about 0.1 micrometers being convenient.

Methods for depositing silicon on silicon oxide and/or nitride are well known in the art. CVD, LPCVD, PECVD and sputtering are examples. An additional advantage of using silicon for the nucleating seed layer is that once some silicon is present on layer 24, then during a subsequent silicon deposition process, additional silicon may be made to deposit on the existing silicon seed regions and not on the silicon free regions of silicon oxide or nitride layer 24 by adjusting the deposition conditions according to methods well known in the art. This is a great convenience in manufacturing since it is not necessary to provide additional reactors for disparate materials.

Following formation of nucleating seed layer 26, the structure is covered by mask 28 (see FIG. 3). Mask 28 at least partially fills trench 18. It is important that mask 28 be thicker over bottom portion 26C of layer 26 above bottom 20 of trench 18 than elsewhere. Mask 28 may extend over surface 12, but this is not essential.

Mask 28 may be of any suitable planarizing material which forms a solid on the semiconductor wafer and which can be differentially etched, i.e., dissolved away without substantially attaching the underlying material. Suitable planarizing materials and methods of application are well known in the art. Examples are organic polymers such as resists and polyimides, or refractory materials such as spin-on glasses. Photoresists have been found to be particularly convenient. Either positive or negative resists may be used.

Negative resists are preferred for very narrow trenches since they have been found to provide better filling of narrow trenches and surface smoothing. The negative resist may be uniformly exposed to polymerize the entire thickness including the portions in trench 18 or left unexposed, and then etched, using for example planarizing etch methods well known in the art, e.g. plasma etch, to remove those portions of layer 28 above surface 12 and in the upper portion of trench 18. Polyimids are applied and etched in an analogous manner using methods well known in the art. No alignment step is required.

Alternatively, negative resist is applied to the substrate surface and the trench and then exposed using the same mask as for trench 18, and aligned therewith. This polymerizes the resist in the bottom of the trench. The exposed resist is developed using conventional resist developer to remove the unpolymerized resist elsewhere. This procedure gives good control over the resist left in the trench but requires an additional alignment step.

With positive resists, a blanket exposure may be provided but is not necessary. A planarizing etch, such as for example an oxygen plasma, is used in the same manner as for the uniformly exposed negative resist or cured polyimide to remove the portions above surface 12 and in the upper portion of trench 18. No alignment is required.

With positive resists a maskless differential exposure techniques can also be used. According to this embodiment, the positive resist (which is insoluble in the unexposed state) is blanket exposed without a mask to a dose just sufficient to render soluble the upper surface portion of layer 28 corresponding to the thickness of layer 28 above surface 12 but insufficient to render insoluble the deeper portions of layer 28 having the desired height within trench 18. When the positive resist is developed, the upper part of the resist above surface 12 and in the upper portion of trench 18 is removed while the lower part of resist layer 28 remains in trench 18. No planarizing etch or alignment is needed.

Whichever material is employed for mask 28, those portions above surface 12 and in the upper portion of trench 18 are removed leaving portion 30 having surface 32 (see FIG. 4) in the lower portion of trench 18. Portion 26U of layer 26 on dielectric 24 in the upper portion of trench 18 and over surface 12 of substrate 10 is uncovered while portion 26C of layer 26 below surface 32 of mask portion 30 in the lower portion of trench 18 remains covered.

Figure 5:
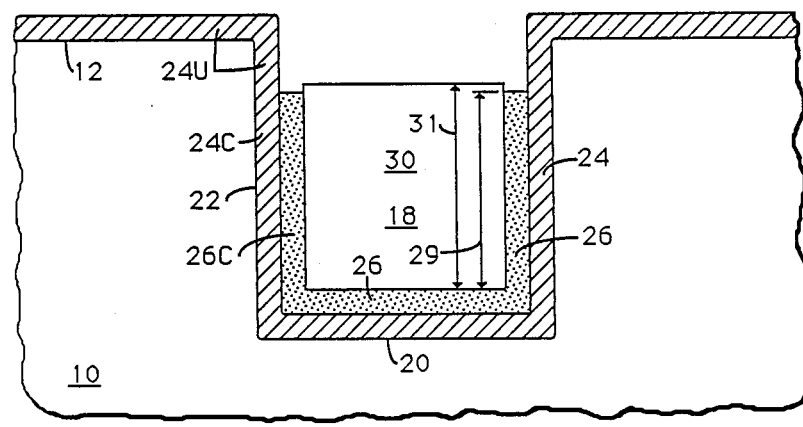

Portion 26U of layer 26 is then removed, thereby exposing corresponding portion 24U of layer 24 while leaving portion 26C of layer 26 in place on portion 24C of layer 24 (see FIG. 5). Wet etching is an example of a suitable technique for removing portion 26U, but other techniques may also be used. The etch should be selective so as to attack the material of layer 26 much more rapidly than the material of layer 24. Etching reagents for removing silicon or chromium or other suitable nucleating materials are well known in the art.

A criteria for selecting a suitable nucleating material for layer 26 is that it must be removable from the upper portion of trench 18 while being left in place in the lower portion of trench 18 using an etching procedure which does not destory the etch mask. Thus, where mask 28 is used to protect the lower trench portion while the etching is carried out in the upper trench portion, a mask material and etch or development process combination must be available which is compatible with the proposed nucleating material to permit the above-described masking and etching operations to be carried out. Those of skill in the art will understand how to select materials for this purpose based upon the criteria and examples given above.

Figure 6:
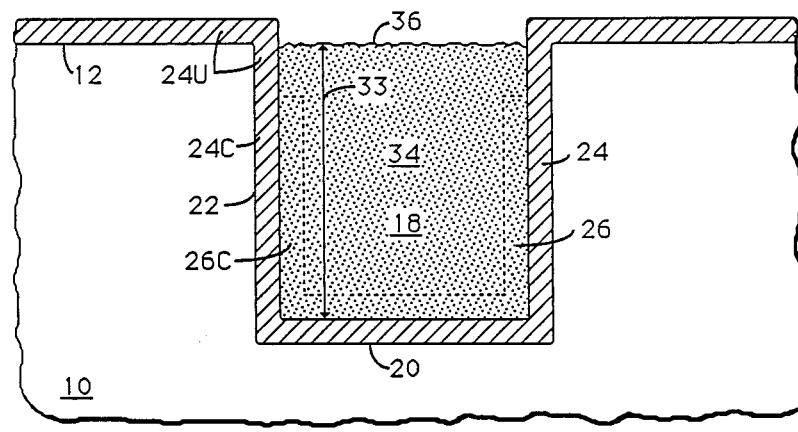

Remaining portion 30 of mask 28 is then removed and trench 18 filled by growing additional filling material 34 having depth 33 on seed portion 26C until surface 36 of filler 34 is approximately level with surface 12 of substrate 10 (see FIG. 6). Polycrystalline semiconductor, especially polysilicon is suitable for the material of filler 34. However, other materials which nucleate on layer 26C but not on exposed portions 24U of layer 24 may also be used. Where it is desired to minimize the differential thermal expansion of the filled trench relative to the substrate, it is desirable that, if possible, the same material be used for filler 34 as for substrate 10.

As noted earlier, it is well known in the art to deposit silicon so that it nucleates on an existing silicon region but does not nucleate on an adjacent silicon oxide or silicon nitride or glass region. CVD or LPCVD are preferred techniques. Selective deposition of silicon on seeded nucleating surfaces is described for example in U.S. Pat. No. 4,473,598 incorporated herein by reference.

By adjusting the thickness of layer 26 and height 31 of mask portion 30 (and thereby height 29 of remaining seed layer 26C), the topology of the growth of filler material 34 in trench 18 can be controlled. It is important that height 29 not extend too far up sidewall 22 of trench 18 since this tends to produce undesirable artifacts on and/or around filler 34 at surface 36. Thus, by having a simple means of selecting height 29 before depositing refill material 34, a more smoothly filled, void free, trench is obtained by the method of the present invention.

It has been found that having height 29 in the range of about 0 to 70 percent of trench depth 19 gives satisfactory results with about 2 to 10 percent being convenient and about 5 percent being preferred. Zero percent corresponds to having layer 26 only on the bottom of trench 18 without significant extension of layer 26 up dielectric layer 24 on trench sidewalls 22. The narrower the trench relative to its depth, the lower the percentage that should be used.

Figure 7:
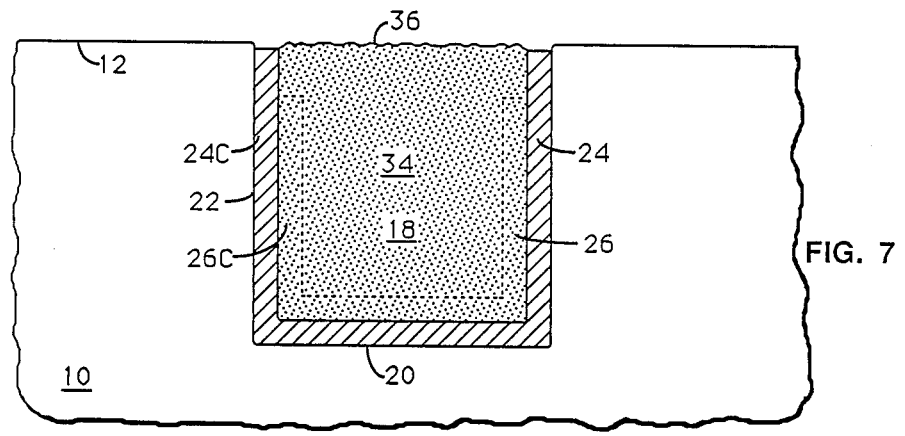

Following the step of FIG. 6, the structure may now be used directly for fabrication of devices using conventional techniques well known in the art. However, if desired, portion 24U of layer 24 may first be etched off as shown in FIG. 7, but this is not essential.

It will be apparent to those of skill in the art, that there has been described an improved method for forming filled trenches in electronic substrates. Such filled trenches are suitable for use as isolation walls in IC's or as trench capacitors in high density semiconductor memory circuits or for other purposes.

It will also be apparent that while silicon is described as an exemplary material in which such trenches are formed and as a desirable trench filling material, other substrate materials and other trench filling materials may also be used. Non-limited examples are, germanium, III–V's, II–VI's, Sic and the like. Further, the trenches may also be filled with other materials having the property of nucleating on the material of layer 26 but not nucleating on the material of layer 24, at the same time. Those of skill in the art will understand how to choose such materials based on the description given herein.

Further steps may be added to the process depending upon the function the filled trench is intended to serve. For example (see FIG. 2) channel-stop implant 23 may be provided. This may be done at any time including both before or after formation of trench 18, but is most conveniently done before trench 18 is refilled by material 34.

Many variations may be made in the materials and particular steps used in the present invention which will be apparent to those of skill in the art based on the description given herein and it is intended to include all such variations in the claims which follow.

We claim:

1. A process for forming poly filled trenches, comprising:
   providing a substrate having a principal surface;
   etching a trench having a sidewall extending a predetermined depth into the substrate from the substrate surface;
   covering at least the sidewall with a dielectric;
   covering the dielectric with a poly layer having a first thickness and extending over the substrate surface;
   at least partially removing the poly layer from above the substrate surface and completely removing the poly layer from the dielectric on an upper portion of the trench sidewall leaving a remaining portion of the poly layer on the dielectric on a lower portion of the trench sidewall; and
   depositing further poly on the remaining portion of the poly layer to fill the trench.

2. The process of claim 1 wherein the step of covering at least the sidewall with a dielectric comprises forming a further dielectric on the substrate surface anytime before forming the dielectric on the trench sidewall.

3. The process of claim 1 wherein the remaining portion of the poly layer on the dielectric on a lower portion of the trench sidewall has a height along the sidewall greater than the first thickness and less than about seventy percent of the trench depth.

4. The process of claim 1 wherein the step of removing the poly layer from the dielectric on an upper portion of the trench sidewall comprises, first, applying a masking layer to cover the poly layer, second, partially removing the masking layer to leave a portion covering a first part of the poly layer on a lower portion of the trench sidewall and expose a second part of the poly layer elsewhere and, third, etching away the second part of the poly layer.

5. The process of claim 1 wherein the step of covering at least the trench sidewall witha dielectric comprises covering with a dielectric having a predetermined thickness in the range of 0.1 to 1.0 micrometers.

6. The process of claim 1 wherein the step of covering the dielectric with a poly layer comprises covering with a poly layer having a predetermined thickness in the range 0.05 to 0.15 micrometers.

7. The process of claim 1 wherein the step of depositing further poly on the remaining portion of the poly layer to fill the trench comprises depositing the further poly selectively on the remaining poly layer.

8. A process for forming poly filled trenches, comprising:
providing a substrate having a principal surface;
etching a trench a predetermined depth into the substrate from the substrate surface, wherein the trench has an interior surface;
covering the interior surface with a dielectric;
covering the dielectric with a poly layer extending over the substrate surface;
applying a masking layer to cover the poly layer;
partially removing the masking layer to leave a portion covering a first part of the poly layer in a lower portion of the trench and to expose a second part of the poly layer elsewhere;
etching away the second part of the poly layer;
wherein the step of partially removing the masking layer comprises rendering an upper portion of the masking layer intended to be removed soluble in a solvent while leaving the portion covering the first part of the poly layer in the lower part of the trench insoluble to the solvent; and
depositing further poly on the remaining portion of the poly layer to fill the trench.

9. The process of claim 8 further comprising after the step of rendering the upper part of the masking layer soluble, exposing the masking layer to the solvent to remove the soluble upper portion thereof.

10. A process for forming isolation walls for electronic devices in a substrate, comprising:
forming a trench having a sidewall and a bottom extending into the substrate a predetermined depth;
lining at least the sidewall of the trench with a dielectric;
forming on the dielectric a polycrystalline semiconductor layer having a first thickness;
completely removing an upper portion of the polycrystalline semicondcutor layer from the dielectric in the trench, leaving a lower portion of the polycrystalline semiconductor layer on the dielectric in the trench extending up the dielectric on the sidewall a distance greater than the first thickness and less than about seventy percent of the trench depth; and
filling the trench with a further polycrystalline semiconductor.

11. The process of claim 10 wherein the step of filling the trench comprises selectively growing polycrystalline semiconductor on the lower portion of the polycrystalline semiconductor layer.

12. The process of claim 10 wherein the trench extends into the substrate from a principal surface thereof and the step of filling the trench comprises selectively growing polycrystalline semiconductor on the lower portion of the polycrystalline semiconductor layer and not on the principal surface of the substrate.

13. The process of claim 10 wherein the trench extends into the substrate from the principal surface thereof and wherein the step of lining at least the sidewall of the trench with a dielectric comprises also covering the principal surface of the substrate and the trench bottom with a dielectric.

14. The process of claim 10 wherein the step of removing an upper portion of the polycrystalline semiconductor layer on the dielectric, while leaving a lower portion of the polycrystalline semiconductor layer in place on the dielectric comprises forming a mask at least partly filling the trench, then removing an upper part of the mask corresponding to the upper portion of the polycrystalline semiconductor layer and leaving a lower part of the mask corresponding to the lower portion of the polycrystalline semiconductor layer, and then etching away the exposed upper portion of the polycrystalline semiconductor layer.

15. The process of claim 10 wherein the trench extends into the substrate from a principal surface thereof and wherein the step of lining at least the sidewall of the trench with a dielectric comprises covering the principal surface with a further dielectric and further comprising, after the step of filling the trench, removing the further dielectric.

16. A process for filling a trench from a seed layer, comprising:
providing a substrate having a principal surface;
etching a trench having a sidewall and bottom extending a predetermined depth into the substrate from the principal surface;
applying a seed layer having a first thickness to the sidewall;
depositing a planarizing masking layer which substantially fills the trench and extends above the substrate surface;
removing a first portion of the masking layer above the substrate surface and in an upper portion of the trench, leaving a second portion of the masking layer covering the seed layer in a lower portion of the trench to a height greater than the first thickness;
completely removing the seed layer from the sidewall in the upper portion of the trench leaving a remaining portion of the seed layer on the sidewall in the lower portion of the trench; and
filling the trench by depositing additional material which nucleates on the remaining portion of the seed layer.

17. The process of claim 16 wherein the remaining portion of the seed layer has a height measured along the sidewall greater than the first thickness and less than about seventy percent of the trench depth.

18. The process of claim 16 wherein the seed layer is a polycrystalline material.

19. The process of claim 16 wherein the seed layer and the additional material comprise the same element.

20. The process of claim 16 wherein the substrate comprises a semiconductor and the additional material comprises the same semiconductor.

* * * * *